(12) United States Patent
Swoboda

(10) Patent No.: US 9,557,355 B2
(45) Date of Patent: Jan. 31, 2017

(54) DETECTING POWER SUPPLY SAG IN AN INTEGRATED CIRCUIT

(71) Applicant: Texas Instruments Incorporated, Dallas, TX (US)

(72) Inventor: Gary Lynn Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 192 days.

(21) Appl. No.: 14/196,099

(22) Filed: Mar. 4, 2014

(65) Prior Publication Data

US 2014/0253141 A1   Sep. 11, 2014

Related U.S. Application Data

(60) Provisional application No. 61/772,700, filed on Mar. 5, 2013.

(51) Int. Cl.
*G01R 19/165* (2006.01)
(52) U.S. Cl.
CPC .............................. *G01R 19/16552* (2013.01)
(58) Field of Classification Search
None
See application file for complete search history.

(56) References Cited

U.S. PATENT DOCUMENTS

| 5,457,368 | A | * | 10/1995 | Jacobsen | G01B 7/003 200/11 R |
| 5,748,033 | A | * | 5/1998 | Kaveh | G05F 1/59 327/321 |
| 5,822,166 | A | * | 10/1998 | Massie | H02H 3/243 307/87 |
| 5,917,230 | A | * | 6/1999 | Aldrich | H01L 23/5286 257/207 |
| 6,094,075 | A | * | 7/2000 | Garrett, Jr. | G06F 13/4077 327/108 |
| 6,118,676 | A | * | 9/2000 | Divan | H02J 3/1814 323/207 |
| 9,270,170 | B2 | * | 2/2016 | Divan | H02M 3/156 |
| 2008/0278976 | A1 | * | 11/2008 | Schneider | H02J 3/1814 363/37 |
| 2009/0115254 | A1 | * | 5/2009 | Dawley | H02J 3/12 307/103 |
| 2015/0123700 | A1 | * | 5/2015 | Ahmed | G01R 31/40 324/764.01 |

\* cited by examiner

*Primary Examiner* — Jermele M Hollington
(74) *Attorney, Agent, or Firm* — Lawrence J. Bassuk; Charles A. Brill; Frank D. Cimino

(57) ABSTRACT

An integrated circuit is provided with a voltage sag detector (VSD) within the integrated circuit package. The VSD is coupled to a voltage reference and to the power distribution bus within the integrated circuit. The VSD has an output for indicating when a voltage level on the power distribution bus sags below a voltage level provided by the voltage reference.

5 Claims, 7 Drawing Sheets

DETECTING POWER SUPPLY SAG IN AN INTEGRATED CIRCUIT

CLAIM OF PRIORITY UNDER 35 U.S.C. 119(e)

The present application claims priority to and incorporates by reference U.S. Provisional Application No. 61/772,700, filed Mar. 5, 2013, entitled "DETECTING POWER SUPPLY SAG IN A REMOTE SYSTEM."

FIELD OF THE INVENTION

This invention generally relates to detecting power supply sag in an integrated circuit, and in particular when the power terminals of the integrated circuit are difficult or impossible to probe or the system with the integrated circuit is deployed in the field and not accessible.

BACKGROUND OF THE INVENTION

An electronic system typically includes one or more integrated circuits (IC) mounted on a circuit board, such as a printed circuit board (PCB), for example. A power source or power regulator may be mounted on the PCB or coupled to the PCB to provide power for the ICs. During system operation, the current drawn by an IC may change rapidly in response to various circuits within the IC being activated and de-activated. In turn, these rapid changes in current may result in momentary, intermittent drops in the voltage provided to the IC due to the effects of inductance and resistance in the voltage supply buses between the power supply or regulator and the IC.

In some cases, the intermittent voltage may drop below the value required to operate the IC and be severe enough to cause the IC to malfunction.

BRIEF DESCRIPTION OF THE DRAWINGS

Particular embodiments in accordance with the invention will now be described, by way of example only, and with reference to the accompanying drawings.

Figure 1:
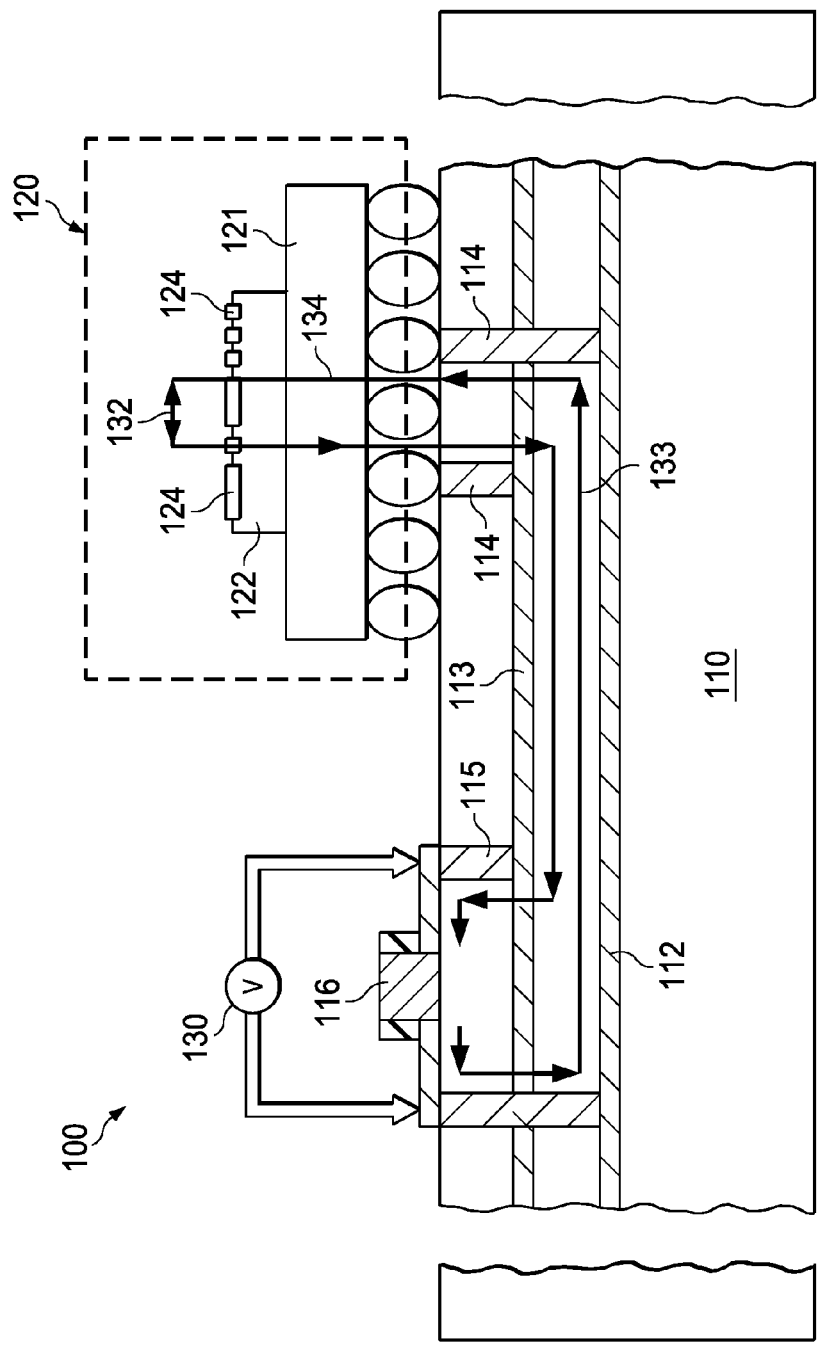
FIG. 1 is a cross-sectional view of a circuit board with an example integrated circuit mounted on the circuit board with buried vias.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

During system operation, the current drawn by an IC may change rapidly in response to various circuits within the IC being activated and de-activated. In turn, these rapid changes in current may result in momentary, intermittent drops in the voltage provided to the IC due to the effects of inductance and resistance in the voltage supply buses between the power supply or regulator and the IC. Bypass capacitors are typically mounted nearby ICs on a PCB in order to help mitigate the effects of conductor resistance and inductance and reduce the amount of voltage variation seen by an IC. In some cases, the intermittent voltage drops may be severe enough to cause the IC to malfunction. In this case a design or system engineer may attempt to monitor the IC's power supply voltage behavior to determine if it is the source of this class of failure.

Previously, to determine the power supply voltage behavior required probing the IC power supply as close to the IC power pins as practical. This may require probing an IC's power supply balls of a ball grid array (BGA) or leads, for example. In many cases the use of buried vias can make this difficult since their use may mean there may be no probe points close to the IC's power pins. In some cases, the integrated circuit may be on a board that is installed in a chassis where this installation prevents probing even though probe points on the board may be available. In some cases, the system with the integrated circuit may be deployed in the field and not be accessible to test equipment.

Embodiments of the invention may provide one or more on-chip comparators and latches that compare the voltage inside the IC to a reference voltage and latch an indication of any occurrence of the voltage dropping below the reference voltage. In this manner, a system designer or test engineer may easily determine if the IC is being provided with an adequate voltage level without the need of conventional probing. Instead, the occurrence of a power supply voltage dropping below a specific value may be recorded in a manner that survives the low voltage condition and a system restart (warm reset or other restart). This may be reported by software or observed through the use of development tools long after it has occurred.

FIG. 1 is a cross-sectional view of an electronic system 100 that has a circuit board 110 with an example integrated circuit 120 mounted on the circuit board with buried vias 114. While only two vias 114 are illustrated here for clarity, it is understood that IC 120 may include dozens or even hundreds of connections that are coupled to buried vias on PCB 110.

PCB 110 is representative of known types of circuit boards that are implemented using several layers of substrate material, where each layer of substrate material may have signal conductors and/or power conductors and/or power planes etched or printed on the surface of the layer. Interconnections between the various layers and with components mounted on the PCB may be made using vias such as vias 114 and 115, for example. The PCB is typically formed from multiple layers of epoxy impregnated fabric, but other types of multilayer substrates are also well known, such as ceramics, etc. for example. The construction and fabrication of PCBs is well known and need not be described in further detail herein.

IC 120 is representative of a wide range of known integrated circuits. An integrated circuit typically includes a package substrate or lead frame 121 onto which a semiconductor die 122 is mounted. Various circuits 124 may be formed on a semiconductor substrate using well known process technologies to form die 122. Conductive layers are also formed on the semiconductor substrate to provide power to the various circuits 124. IC 120 may be encapsulated to form a finished packaged IC. In this example, IC 120 is packaged as a ball grid array, in which a matrix of solder bumps are provided to connect signals and power from die 122 to pads on PCB 110. In other embodiments, die 122 may be configured as a bare die and mounted directly to PCB 110, for example. The general construction and fabrication of ICs is well known and need not be described in further detail herein.

A power source or power regulator may be mounted on PCB 110 or coupled to the PCB to provide power for the ICs. Power buses as indicated at 112, 113 may be used to provide power to IC 120. The power buses may be in the form of an array of buss lines or a solid plane, for example, as is well known.

In this example, since IC 120 is packaged as a BGA and mounted to PCB 110 using buried vias 114, there is no way to easily probe the contacts of IC 120 to determine what voltage is actually being provided. Typically, the closest probe point may be a bypass capacitor, such as capacitor 116.

A voltage monitor or recorder 130 may be attached to bypass capacitor 116 using probe points, for example. Voltage recorder 130 may observe the voltage present on bypass capacitor 116, but this voltage may not be the same as what is actually seen by internal circuits 124, as indicated at 132. This is because there is a loop inductance 133 that is intrinsically formed by the segments of power buses 112, 113, the leads and packaging of capacitor 116, and signal segments 134 through the ball grids and lead frame 121 of IC 120, for example. Each time current to IC 120 suddenly increases due to circuit activity in IC 120, capacitor 116 will try to provide an additional amount of current from the charge stored on capacitor 116. However, the loop inductance 133 will cause a voltage drop in response to changes in current that momentarily reduces the voltage 132 that is actually seen by circuits 124.

Figure 2:
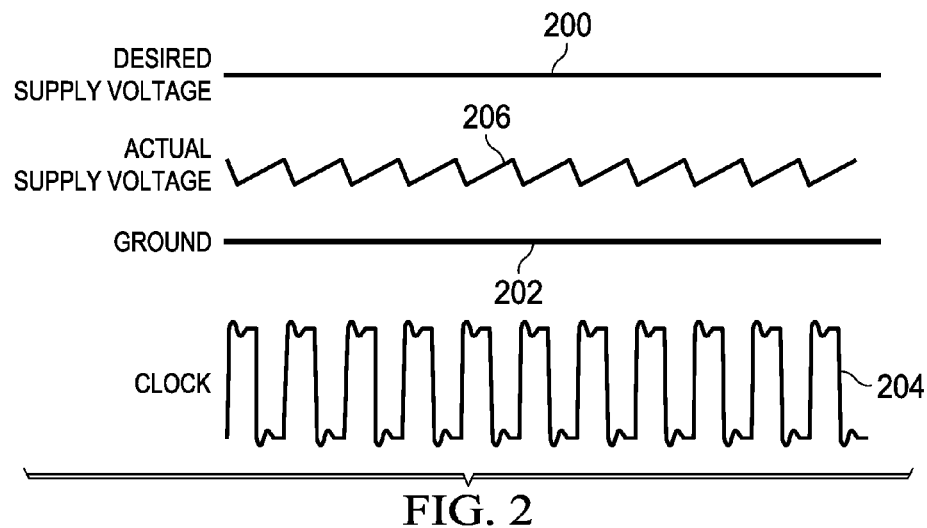
FIG. 2 is an example plot of voltage received by the integrated circuit of FIG. 1.

FIG. 2 is an example plot of voltage 132 received by the integrated circuit of FIG. 1. Plot line 200 illustrates a desired voltage level for IC 120, as referenced to ground signal 202. When device activity is minimal, the supply voltage may be stable as shown by plot 200. A clock signal 204 is representative of a system clock signal that may be used by circuitry 124 for synchronous operation. As is well known, during each period of a system clock signal, various transistors within circuits 124 are turned on and turned off to perform various logic functions. Each time a transistor is turned on or off, a corresponding amount of current change occurs. Transient current changes may then cause transient voltage changes as indicated by plot 206. As discussed above, the full extent of the voltage transients to internal voltage 132 as indicated by plot 206 will not be visible at bypass capacitor 116. When device activity is heavy, the supply voltage may become marginal and may drop out of specification for brief periods of time.

Figure 3:
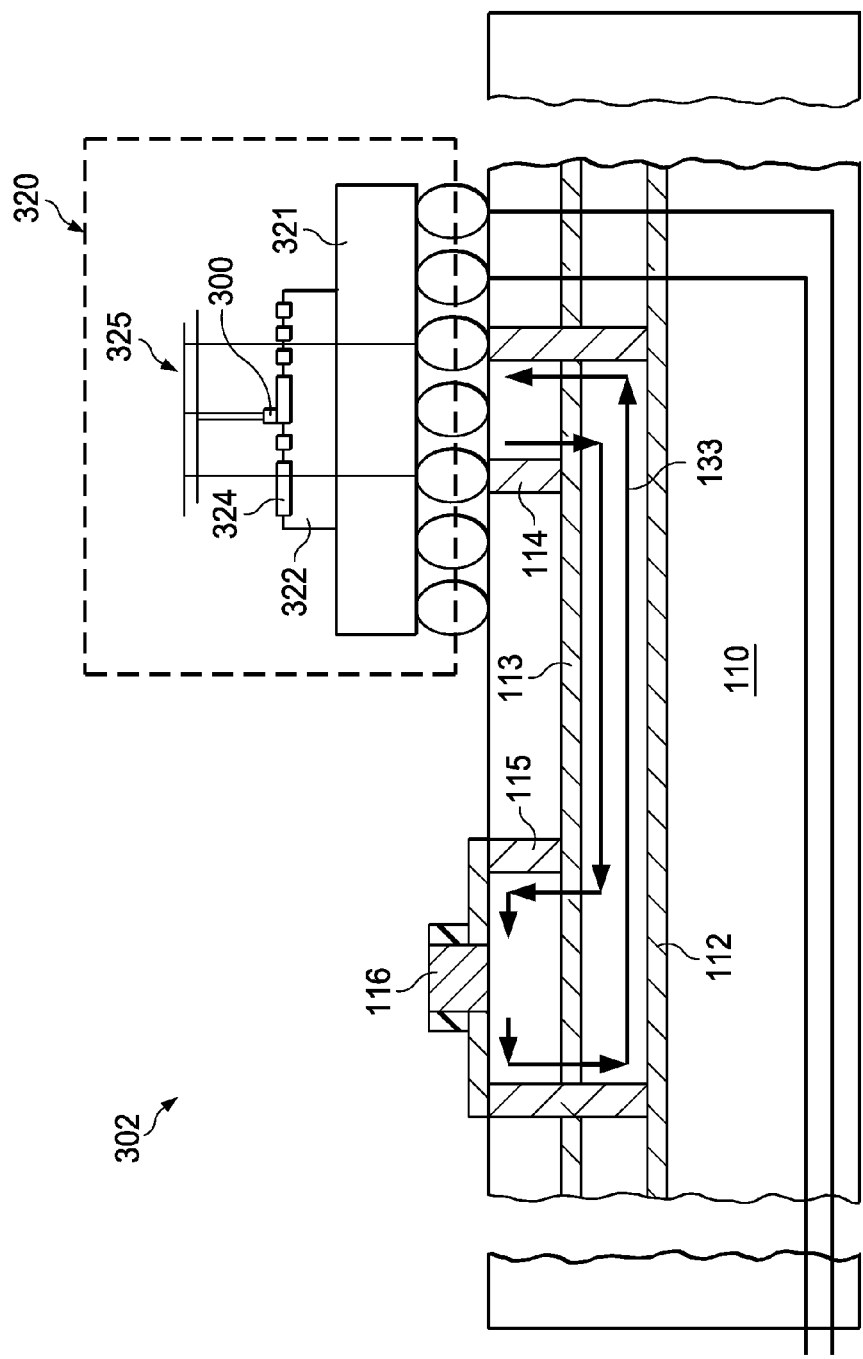

FIG. 3 is a cross-sectional view of an electronic system 302 that has a circuit board 110 with an example integrated circuit 320 mounted on the circuit board with buried vias 114. While only two vias 114 are illustrated here for clarity, it is understood that IC 320 may include dozens or even hundreds of connections that are coupled to buried vias on PCB 110.

IC 320 is representative of a wide range of known integrated circuits. An integrated circuit typically includes a package substrate or lead frame 321 onto which a semiconductor die 322 is mounted. Various circuits 324 may be formed on a semiconductor substrate using well known technologies to form die 322. Conductive layers are also formed on the semiconductor substrate to provide power to the various circuits 324. IC 320 may be encapsulated to form a finished packaged IC. In this example, IC 320 is packaged as a ball grid array, in which a matrix of solder bumps are provided to connect signals and power from die 322 to pads on PCB 110. In other embodiments, die 122 may be configured as a bare die and mounted directly to PCB 110, for example. The general construction and fabrication of ICs is well known and need not be described in further detail herein.

As discussed above, a power source or power regulator may be mounted on PCB 110 or coupled to the PCB to provide power for the ICs. Power buses as indicated at 112, 113 may be used to provide power to IC 120. The power buses may be in the form of an array of buss lines or a solid plane, for example, as is well known. Bypass capacitors, such as capacitor 116, are typically mounted nearby ICs on a PCB in order to help mitigate the effects of conductor inductance and reduce the amount of voltage drop seen by an IC.

In this example, a voltage sag detector 300 is coupled directly to IC 320's internal power buses 325. Whenever the internal voltage on bus 325 drops below a reference voltage, a voltage sag bit latch may be set, as will be described in more detail below. Once set, a design engineer or other action may cause a program to be executed that reads the contents of the voltage sag bit latch. In this manner, one may determine if the internal voltage of IC 320 drops below the reference voltage level.

Figure 4:
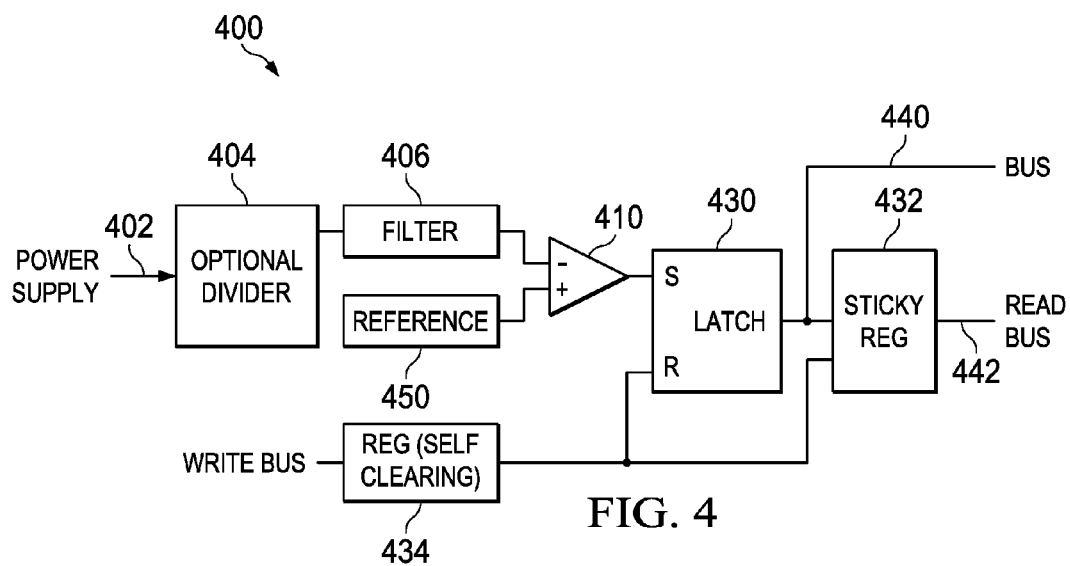
FIGS. 3-6 illustrate embodiments of a voltage sag detector that may be implemented within an integrated circuit.

FIG. 4 is a schematic of a voltage sag detector (VSD) 400 that may be implemented within an integrated circuit to monitor voltage sag within the IC. An on-chip comparator 410 may be used to detect power supply droop compared to a local reference 450 that provides a reference voltage. The reference 450 may be a band gap reference, a digital to analog converter, or another supply, such as a filtered supply for a phase locked loop (PLL), or a percentage of that supply, for example. The comparator may be coupled to a supply power bus 402 inside the IC close to where the power lines are received, for example. Depending on the magnitude of the reference voltage from reference 450, the monitored voltage signal may be divided/scaled by a divider 404. The monitored signal may also be filtered to provide a more average signal. Filter 406 may be a simple resistor-capacitor (RC) filter, for example.

Comparator 410 may be a differential receiver normally used for serializer/deserializer (SerDes) or other application such as analog to digital conversion, or some other known comparator design. It may have two analog input terminals V+ and V− and one binary digital output Vout. While V+ is greater than V−, then Vout is asserted, and while V+ is less than V−, then Vout is de-asserted, for example. The reference voltage 450 is compared to the power supply voltage 402. When the power supply voltage drops below the reference, a voltage sag indicator bit latch 430 may be set and may be readable through an optional sticky register 432 on read bus 442, or the latch may be readable directly on a read bus 440, for example. In this example, latch 430 is a simple set-reset (RS) type latch. Latch 430 and/or sticky register bit 422 may be reset with a write to a register bit 434, where register bit 434 is self clearing and forms a pulse to reset register 430 and/or register 432, for example. The register and sticky bit may have the same or slightly different functions. For instance, the sticky bit records the occurrence of the voltage drop in a manner that survives a system restart, especially those that may occur as a result of the low voltage event. The R-S Latch may be designed to share the clearing mechanism of the sticky bit or have a separate clearing mechanism. The setting of the R-S Latch or sticky bit may also be used to latch other information as to state of the chip when the disruptive event occurs.

Some care should be used in the design of VSD 400 so that it is able to operate correctly even when the power supply voltage drops below the specified threshold. The VSD is designed to operate correctly in very low voltage conditions to assure it properly records and reports the aforementioned conditions. This may be done by sizing the transistors used to implement the VSD in a manner that allows the VSD to operate on a lower supply voltage than the main circuitry of the IC, for example. The VSD sticky bit may also be designed to be non-volatile so that it will provide a correct indication of a power sag even after the IC has been powered down and restarted. As such, the sticky bit may be implemented using now known or later developed non-volatile techniques, such as: flash memory, ferroelectric memory, magnetoresistive memory, etc., for example.

Figure 5:
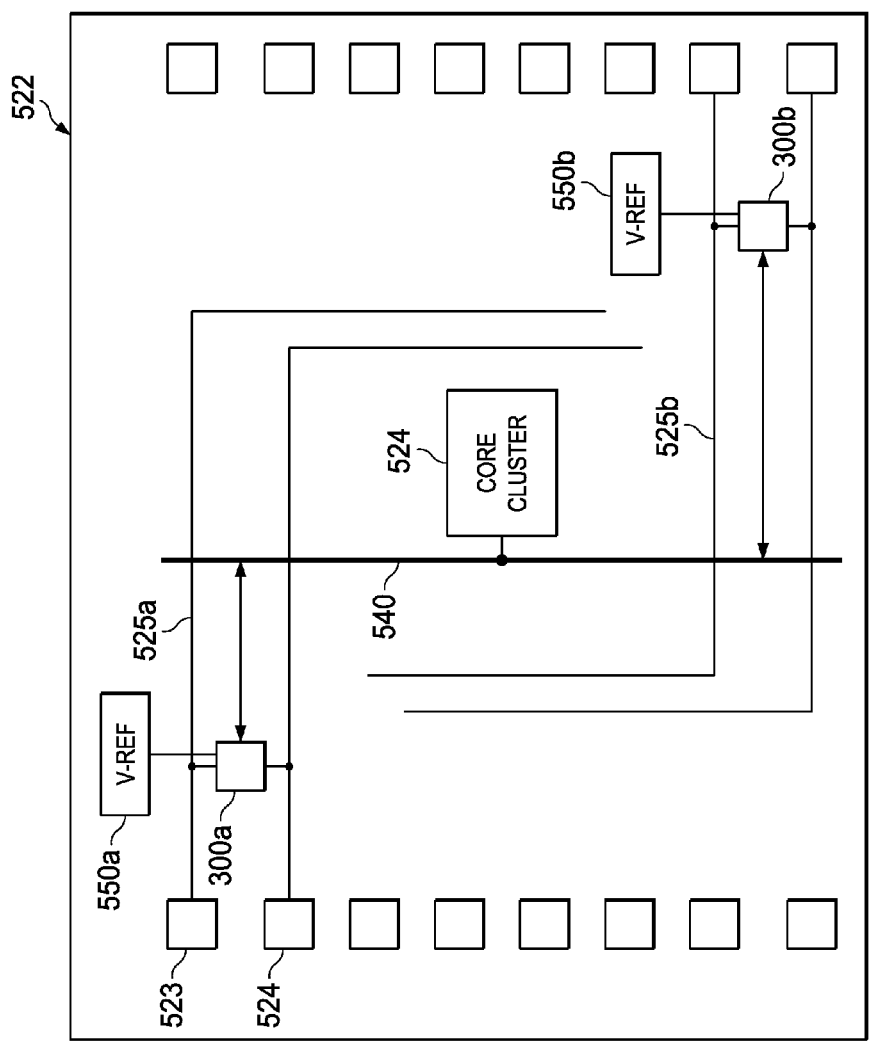

FIG. 5 is an illustration of an example IC 522 that includes a high performance cluster of cores 524, for example. IC 522 includes a voltage sag detector 300a as described above that is connected to voltage and ground bond pads 523, 524. Voltage sag detector 300a compares the supply voltage on bus 525a to a reference voltage provided by reference 550a and latches a sag bit anytime the power supply voltage sags below the reference. The core cluster 524 may include processors and memory (e.g. caches) to hold instructions for the processors. A program may be provided for core cluster 524 that may read the sag bit latch in sag monitor 300a via bus 540, as described above in more detail.

In this example, a second voltage sag monitor 300b may be coupled to voltage bus 525b and to voltage reference 550b. Voltage bus 525a and 525b may provide different voltage levels, for example. Alternatively, voltage bus 525a and 525b may provide the same voltage level, but be supplied by a different regulators that can be turned off at different times to save power, for example. Depending on the voltage levels, reference 550a and 550b may be the same, or may be separate references. Read bus 540 may also be coupled to allow core cluster 524 to read the latch bit in sag monitor 300b, for example. In this manner, both voltage buses may be monitored for voltage sag by a program executed on the core cluster 524.

Figure 6:
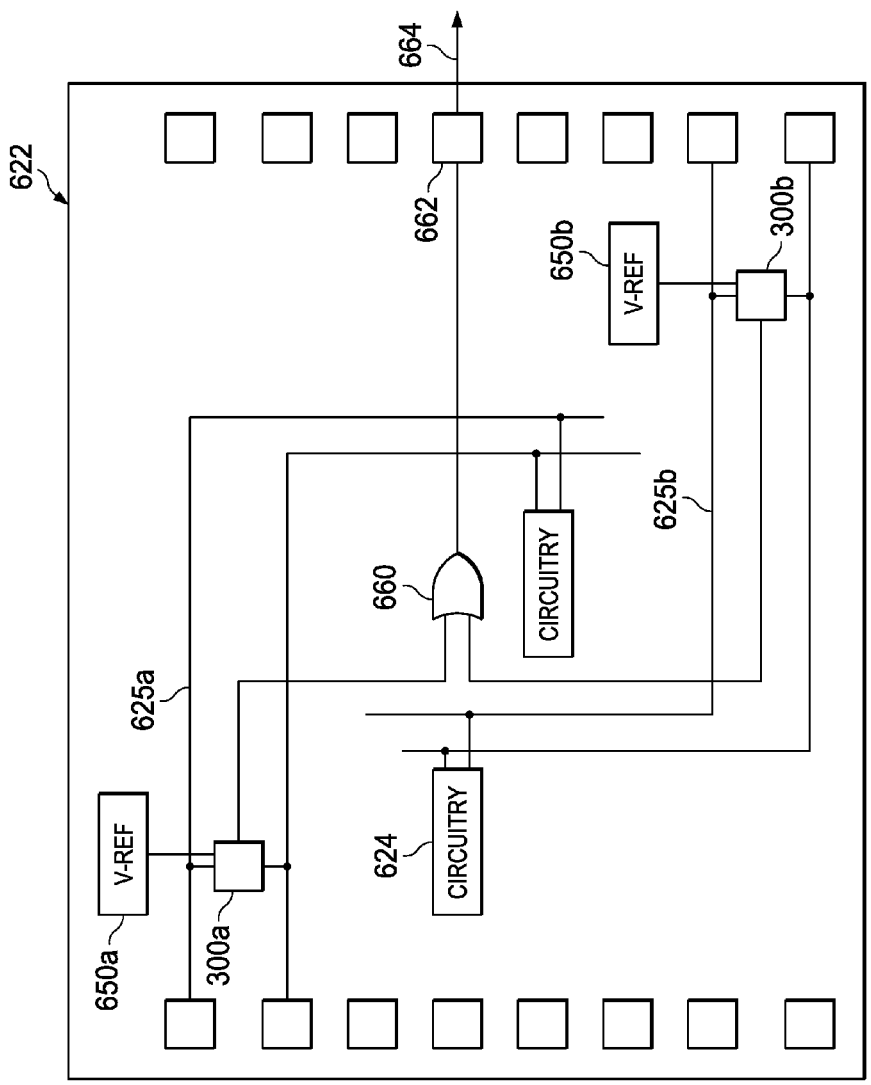

FIG. 6 is an illustration of an example IC 622 that includes circuitry 624, for example, which may or may not be a core cluster. IC 622 includes a voltage sag detector 300a as described above that is coupled to voltage and ground signals. Voltage sag detector 300a compares the supply voltage on bus 625a to a reference voltage provided by reference 650a and latches a sag bit anytime the power supply voltage sags below the reference, as described in more detail above. In this example, rather than being coupled or in addition to being on-chip logic, voltage sag detector 300a may be coupled to an external signal 664 via bond pad 662, and thereby to signal 450 in PCB 110, for example.

In this example, a second voltage sag monitor 300b may be coupled to voltage bus 625b and to voltage reference 650b. Voltage bus 625a and 625b may provide different voltage levels, for example. Alternatively, voltage bus 625a and 625b may provide the same voltage level, but be supplied by different regulators that can be turned off at different times to save power, for example. In this example, the sag bit latch outputs from both voltage sag detectors 300a, 300b may be OR'd together by OR logic 660 to provide a single output signal 664, for example. OR logic 660 may be a gate or a wire-OR function, for example. The OR gate function may be replaced with a selector, such as a multiplexor, for instance, to choose one of a plurality of detector outputs.

In some embodiments, signal 664 may be part of a JTAG diagnostic chain, for example. Joint Test Action Group (JTAG) is the common name for the IEEE 1149.1 Standard Test Access Port and Boundary-Scan Architecture. In this case, the scan chain may couple directly to the sag bit latch of each voltage sag detector 300a, 300b, for example. These sag bits could also be viewed though other types of test ports. They could be viewed directly via the test port actions or by memory accesses generated via a test port, for example.

While the above examples illustrate voltage sag detectors 300a, 300b being coupled close to respective bond pads, in other embodiments, one or more voltage sag detectors may be coupled to a voltage bus that is located in one or more interior regions of an IC floor plan. This may allow a test engineer to verify that the power distribution buses within the IC are sufficient to provide proper operating voltage to the various regions within the IC, for example.

Figure 7:
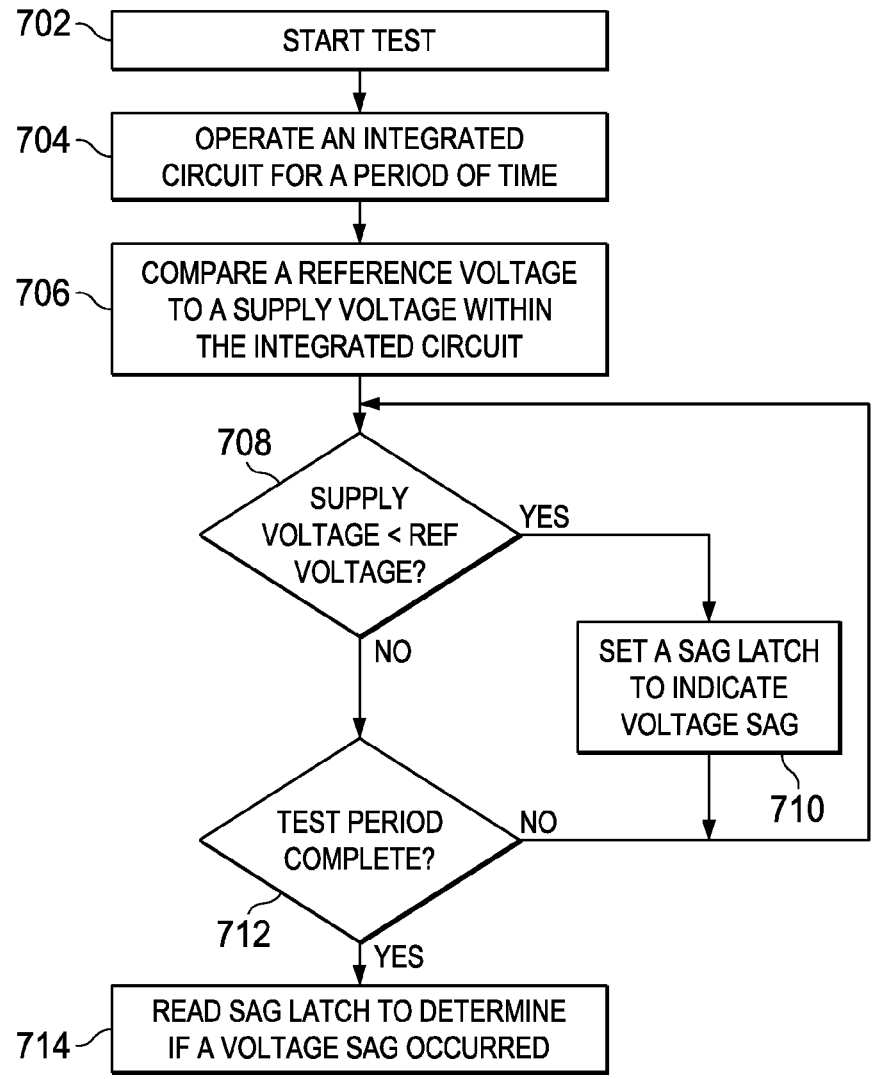
FIG. 7 is a flow chart illustrating the use of a voltage sag detector.

FIG. 7 is a flow chart illustrating operation of a voltage sag detector in a system with at least one integrated circuit. As described in more detail above, the integrated circuit is embodied with one or more voltage sag detection circuits coupled to voltage buses within the IC. The system may include multiple IC's, and one or more of the IC's may be embodied with voltage sag detection circuits, for example.

A test engineer may begin 702 a test to determine if an IC is performing correctly by causing the IC to operate for a period of time 704 while performing a sequence of test patterns designed to cause the IC to stress the power distribution network so as to perform worst case testing, for example. The Test Loop can be executed multiple times each time varying the transient's frequency spectrum to look for resonate points (high impedance points) in the power distribution network. For example, the transient rate may be varied by selecting the period were, for instance, multiple busses are simultaneously switched from all ones to all zeroes or visa versa, for example. The transient amplitude may be varied by selecting the number of bus bits that are switched simultaneously, for example. Combining this process with varying the detector's reference voltages can be used to characterize the robustness of a system's power distribution network. A design engineer can use the information gathered by this process together with information about the device characteristics (manufacturing process data) to determine the behavior of the system's power distribution network and the design's ability to withstand worst case system loading and transient conditions without violating device power supply specifications.

During the test, a reference voltage is compared 706 to a supply voltage level on a power bus within the integrated circuit using a comparator located within the integrated circuit. The comparator may be part of a VSD circuit as described in more detail above.

Whenever 708 the supply voltage the on the power bus drops below the reference voltage, a voltage sag latch bit may be set 710 to indicate that a voltage sag has been detected.

Once the test period is completed 712, a program may be executed to read 714 the sag latch bit to determine if the voltage level has sagged below the reference voltage during the test period of time. As described in more detail above, the sag latch bit may be read by a program executed by a processor located within the IC, if it is so equipped. Alternatively, the sag latch bit may be provided to a signal line that is brought out of the IC. This signal line may be a dedicated signal, or it may be combined as part of another diagnostic signal, such as part of a JTAG mechanism, for example.

The test program may be configured to continue operating the IC for a long period of time while periodically reading the voltage sag bit latch to determine if a voltage sag has occurred. In another embodiment, the VSD may be configured to cause an interrupt to an on-chip processor or to an off-chip test system immediately upon detecting a voltage sag, for example. In another embodiment, the VSD may be configured to cause a warm reset of the system immediately upon detecting a voltage sag, for example. In another embodiment, the VSD may be configured to stop the trace of the chip activity the system immediately upon detecting a voltage sag so as to provide information as to what the system was doing at the time the voltage sag occurred, for example. Combinations of these embodiments are also both possible and practical.

Device suppliers may provide utilities to aid in the characterization of a system's power distribution network that may use a method similar to that described above for ICs that include a VSD. The utility may be in the form of a program that may be loaded into memory within the IC and executed by a processor on the IC when so equipped. Alternatively, the utility may be in the form of a program that may be loaded into a test system or other system that may then be coupled a circuit board that carries the IC, for example.

Figure 8:
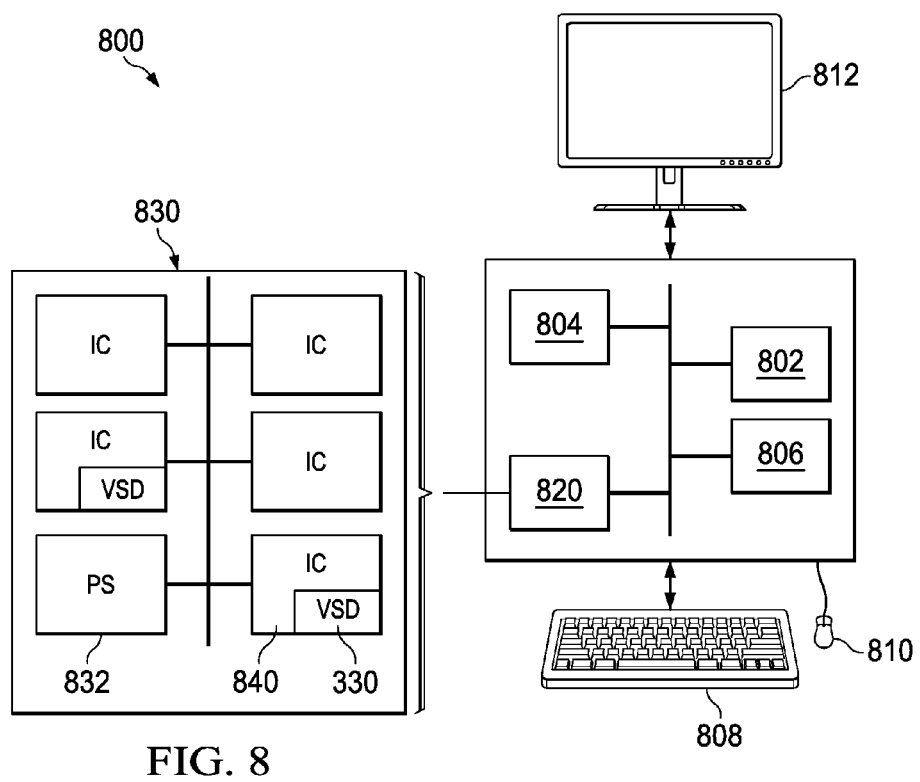
FIG. 8 is an example of a test system using a voltage sag detector within a system under test.

FIG. 8 is an example of a test system 800 using a voltage sag detector within a system under test 830. Control system 800 may be a personal computer, a rack mount computer, a process control computer, or other now known or later developed control system that may be used in a production or lab environment, for example. It may also be the equipment that is normally connected to the system under test 830. Control system 800 includes a processor 802, associated memory 804 for holding processor executable instructions that define the test operation, a storage device 806, and numerous other elements and functionalities typical of digital systems (not shown). In one or more embodiments, a control system may include multiple processors. The digital system 800 may also include input means, such as a keyboard 808 and a mouse 810 (or other cursor control device), and output means, such as a monitor 812 (or other display device). Those skilled in the art will appreciate that the input and output means may take other forms.

The control system 800 may be connected to a network (not shown) (e.g., a local area network (LAN), a wide area network (WAN) such as the Internet, a cellular network, any other similar type of network and/or any combination thereof) via a network interface connection (not shown). This means the control system may or may not be collocated with the system being tested or monitored.

Control system 800 includes input/output logic 820 that may be controllably coupled to system under test 830. System 830 contains one or more ICs 840, one or more of which may include a voltage sag detection (VSD) logic 300, as described in more detail above. System 830 may also include a power supply or regulator 832 that provides voltage to the various ICs 840. Alternatively, an external power supply or regulator may be coupled to system 830 to provide a supply voltage that is provided to the various ICs 840.

The general concept of controlling a test apparatus with a control system and reporting defecting units under test is well known and need not be described in further detail herein. Such a test apparatus and control system may be part of a production line test bed, or may be a standalone system, for example. The control system may also be the equipment that is connected to the system during its normal operation. Techniques for connecting a test apparatus to all of the pins of a system under test is also well known; for example, a test socket may be used, a "bed of nails" arrangement maybe used, a JTAG connection may be provided, etc.

Control system 800 is configured to perform a test of system under test 830 and to determine if a voltage sag is detected by VSD 300 as described in more detail above.

Other Embodiments

While the invention has been described with reference to illustrative embodiments, this description is not intended to be construed in a limiting sense. Various other embodiments of the invention will be apparent to persons skilled in the art upon reference to this description. For example, an integrated circuit may be equipped with a single voltage sag detector coupled near the voltage bond pads. In another embodiment, an integrated circuit may be equipped with several VSDs coupled to supply voltage buses in the interior portion of the IC. The topology of the VSD may include various types of latches to store the voltage sag indicator bit, such as a simple set-reset latch, a sticky latch, a reset on read type latch, a reset on write type latch, etc, for example.

In another embodiment, a voltage sag detector may include two or more comparators referenced to different voltage reference values and coupled to two or more voltage sag indicator register bits so that different amounts of voltage sag may be determined.

In another embodiment, the VSD may be configured to cause an interrupt to an on-chip processor immediately upon detecting a voltage sag, for example. Similarly, in another embodiment the VSD may be configured to interrupt an external test controller immediately upon detecting a voltage sag, for example.

In some embodiments, the VSD may be implemented as part of the IC. In another embodiment, a separate VSD chip may be mounted within the IC package and coupled to the power bus within the IC, for example. This may be useful for trouble shooting an IC during an initial design stage, for example.

In some embodiments, the voltage reference for the VSD may be provided to the IC as a separate input signal. In another embodiment, the voltage reference may be programmable to provide a range of reference voltage values.

In some embodiments, an output signal from the VSD may be provided to an external test system by one or more pins on the integrated circuit that are shared with another function. Selection logic may be provided to select which function is active on one or more IC pins. The selection logic may be programmatically controlled or controlled by an external signal, for example.

Embodiments of the systems and methods described herein may be provided on any of several types of digital systems: digital signal processors (DSPs), general purpose programmable processors, application specific circuits, or systems on a chip (SoC) such as combinations of a DSP and a reduced instruction set (RISC) processor together with various specialized accelerators. A stored program in an onboard or external (flash EEP) ROM or FRAM may be used to implement aspects of the testing.

Portions of the techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. An integrated circuit, comprising:
    (a) voltage and ground leads;
    (b) an internal power bus coupled to the voltage and ground leads;
    (c) circuitry coupled to the power bus, the circuitry including a ball grid array matrix of solder bumps connected to the power bus; and
    (d) a voltage sag detector including:
        i. a voltage reference having a reference voltage output;
        ii. a comparator having an input connected to the reference voltage output, an input coupled to the internal power bus, and a comparator output; and
        iii. a latch having an input coupled to the comparator output and a latch output.

2. The integrated circuit of claim 1 in which the circuitry includes a core cluster having an input coupled to the latch output.

3. The integrated circuit of claim 1 including a logic bond pad and a logic gate having an input connected to the latch output and a logic output coupled to the logic bond pad.

4. The integrated circuit of claim 1 including another voltage sag detector including
    i. another voltage reference having another reference voltage output;
    ii. another comparator having an input connected to the another reference voltage output, an input coupled to the internal power bus, and another comparator output; and
    iii. another latch having an input coupled to the another comparator output and another latch output.

5. The integrated circuit of claim 4 including a logic bond pad and a logic gate having an input connected to the latch output, an input coupled to the another latch output, and a logic output coupled to the logic bond pad.

* * * * *